Sept. 11, 1956 R. W. GEORGE 2,762,985

MECHANICALLY RESONANT FILTER DEVICES

Filed Sept. 20, 1952 2 Sheets-Sheet 1

INVENTOR.
RALPH W. GEORGE

BY Charles H. Brown
ATTORNEY

Sept. 11, 1956 R. W. GEORGE 2,762,985

MECHANICALLY RESONANT FILTER DEVICES

Filed Sept. 20, 1952 2 Sheets-Sheet 2

INVENTOR.
RALPH W. GEORGE

BY Charles H. Brown
ATTORNEY

United States Patent Office 2,762,985

Patented Sept. 11, 1956

2,762,985

MECHANICALLY RESONANT FILTER DEVICES

Ralph W. George, Princeton, N. J., assignor to Radio Corporation of America, a corporation of Delaware Application September 20, 1952, Serial No. 310,591

17 Claims. (Cl. 333—71)

This invention relates to electromechanical devices, and particularly to improved methods of and means for tuning, terminating and mounting magnetostrictive resonators.

Magnetostrictively driven wave filters have some important advantages over electrical wave filters. For example, the Q of a mechanical resonator or "tank" is of the order of a few hundred for nickel, several thousand for various steels, ten thousand for aluminum and its alloys, and as high as sixteen thousand for certain nickel-iron alloys. Furthermore, at radio frequencies the mechanical tank is relatively small and cheap compared to the corresponding electrical tank for achieving the same results, so that many of them can be used in a filter.

A mechanical filter having, for example, a pass band somewhere between 20 cycles and 3000 cycles at, say, 100 kilocycles, to give some indication of the order of characteristics under consideration, may be constructed by making a plurality of mechanical resonator elements coaxially arranged with mechanical coupling means therebetween to form a chain of resonator elements. The dimensions of each resonator element is finely adjusted so that the element resonates at the center frequency of the desired pass band. The resonator elements may be of a material such as nickel or a nickel alloy which will retain a sufficient residual magnetism to permit magnetostrictive operation in the torsion mode. In operation, an end one of the resonators is mechanically oscillated by means of a coil, and an output coil responds to oscillations of an output resonator at the other end of the chain. The frequencies which pass through the filter are those for which the filter is designed. Very sharp frequency cut-off characteristics can be had in a band pass filter of this type.

The mounting and terminating of magnetostrictive wave filters have involved troublesome problems. Since the resonator elements oscillate mechanically, they should be mounted in such a way that the mounting does not interfere with or react back unfavorably on the natural frequency of oscillation of the resonator elements. Also, unless the pass band is narrow, the frequency-amplitude characteristic will be a series of peaks separated by deep valleys and some form of termination resistance is necessary. The end resonator elements cannot be accurately tuned with a mechanical termination resistance in place, and the addition of the termination resistance disturbs the tuning of previously-tuned end resonators. By following the teachings of this invention, the above problems may be overcome.

It is an object of this invention to provide for the rugged mechanical mounting of magnetostrictive resonators in a manner such that the active portions of the resonator are free to vibrate with a minimum of restraint.

It is another object of this invention to provide for the tuning of magnetostrictive resonators, which tuning is not disturbed when the resonator is mounted for use.

It is a further object to provide improved damping terminations for a magnetostrictive resonator.

It is a further object to provide improved means for and methods of tuning, terminating and mounting a mechanical filter.

It is one feature of this invention to provide mounting extensions from the ends of a magnetostrictive resonator, the extensions having a length equal to substantially an odd multiple (including one) of one-fourth the natural wavelength of the resonator. The extensions are securely clamped at a distance corresponding to an odd multiple of a quarter wavelength to a base or frame.

In one aspect, the invention teaches the use of a magnetostrictive resonator having an integral mounting extension of reduced cross section and of length equal to an odd multiple of a quarter wavelength, and an integral mass of enlarged cross section which is securely clamped to a rigid base. By this construction, the length of the integral mounting extension of reduced cross section is fixed in length in the process of manufacture and the characteristics of the resonator are not altered by variations in the exact points at which the integral mass of enlarged cross sections is clamped to the base.

In another aspect, the invention teaches the mounting of a magnetostrictive resonator by means of an extension of reduced cross section, the extension being an odd multiple of a quarter wave in length and being coated with a suitable damping material such as tungsten-loaded silastic or neoprene, or certain adhesive tapes.

In still another aspect, the invention teaches the method of constructing, tuning and mounting a narrow band filter whereby a terminal mass is removably secured to a quarter wave extension, the resonator elements are tuned to a predetermined frequency, the terminal mass is removed and a mechanically lossy line is connected to the extension.

Other objects, advantages, features and aspects of the invention will be apparent to those skilled in the art from the following description taken in conjunction with the appended drawings, wherein.

Figure 1:
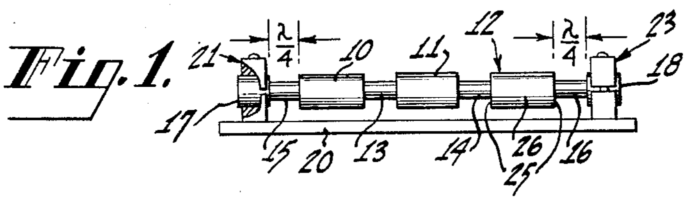
Fig. 1 is an elevation of a three-resonator magnetostrictive wave filter which is rigidly mounted on a base by means of quarter wave extensions.
Figure 5:
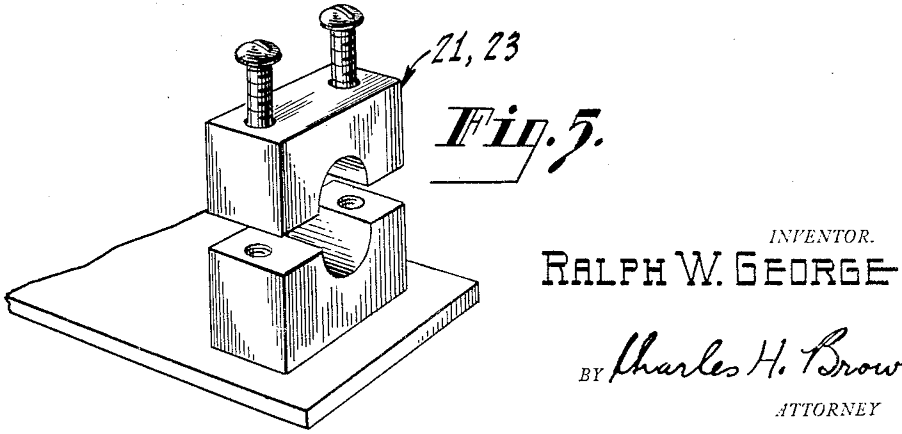
Fig. 5 is a perspective view of a clamping block which may be used, as shown in Figs. 1 through 4, to securely mount a filter on a base.

Referring now to Fig. 1, three resonator elements 10, 11 and 12 are coupled together by quarter wave necks 13 and 14. It will be understood that a reference herein to a dimension of a quarter-wavelength means substantially an odd multiple (including one) of a quarter-wavelength in the material at the operating frequency, e. g., a frequency in a passband of the filter. Resonator elements 10 and 12 are provided with integral extensions 15 and 16, respectively, which are of reduced diameter and which are a quarter wave in length. The extensions 15 and 16 are provided with terminal mounting blocks 17 and 18, respectively, which are of enlarged cross section and which may have any convenient length. Terminal blocks 17 and 18 are securely clamped to base 20 by means of clamping blocks 21 and 23, respectively, the clamping blocks being as shown to greater advantage in Fig. 5.

In the manufacture of the filter shown in Figure 1, the resonator elements 10, 11 and 12, the coupling necks 13 and 14, the mounting extensions 15 and 16, and the terminal blocks 17 and 18 are preferably ground on a lathe from a single piece of stock to form an integral unit. The material may be nickel, nickel alloys having a low temperature-frequency coefficient, nickel-plated aluminum, nickel-plated brass, etc. A material which is very good in all respects is known in the trade as "Ni Span C" and it is a nickel-iron alloy including 42 per cent nickel, 5.5 per cent chromium, 2.5 per cent titanium, 0.06 per cent carbon, 0.4 per cent manganese, 0.5 per cent silicon, and 0.4 per cent aluminum. The resonator elements 10, 11 and 12 are individually tuned to the desired frequency, element 10 being tuned when block 17 and element 11 are securely clamped, element 11 being tuned while elements 10 and 12 are securely clamped and element 12 being tuned while element 11 and terminal block 18 are securely clamped. The resonant frequency of an element such as element 12 can be increased by removing a little material from the ends 25, and the frequency can be decreased by removing material from the mid-section 26. In this manner, the resonator element can be tuned to a desired frequency with an accuracy in the order of 1 part in 100,000. Any number of filter elements can be tuned in this manner.

The construction whereby the length of mounting extensions 15 and 16 is determined in manufacture by the distance between a terminal block and a resonator element, all of which are integral, insures that the characteristics of the filter do not vary with the exact point at which the clamping blocks engage the terminal blocks. Accordingly, the tuning of the filter is established in the process of manufacture and is not affected by assembly and disassembly on the frame 20. The construction whereby the mounting extensions 15 and 16 have a length equal to a quarter wave insures that the adjacent resonator elements are free to vibrate without any appreciable restraint from the rigidly held terminal blocks.

The construction shown in Figure 1 is especially useful for very narrow band filters. Filters designed to provide a wider passband require some form of resistive termination. The construction of such filters has been complicated by reason of the fact that the resonator elements are tuned prior to the addition of a lossy termination and then the addition of the termination tends to disturb the previously established natural frequency of the resonator element. This difficulty may be overcome by the construction illustrated in Figure 2 which corresponds to that shown in Figure 1 except that the mounting extensions 15' and 16' are three-fourth of a wavelength and they are coated with a damping material represented at 30, 30. This damping material may, for example, be tungsten-loaded silastic or neoprene. Because of the fact that mounting extension 15' and 16' have a length equal to an odd multiple of a quarter wave, the addition of the damping material 30 does not disturb the predetermined natural resonant frequency of resonator elements 10 and 12. The lengths of the mounting extensions may be higher odd multiples of a quarter wavelength to provide additional area for the application of damping material when higher termination losses are desired.

Figure 2:
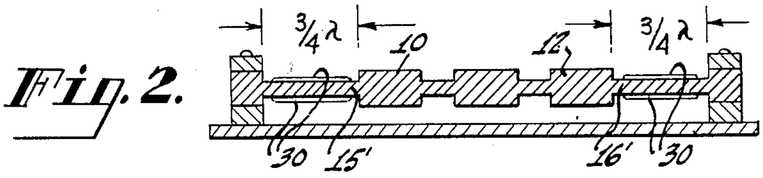
Fig. 2 is a vertical sectional view of a three-resonator filter securely mounted on a base by means of three-fourths wavelength extensions which are coated with a damping material to provide resistive terminations for the filter.

By way of example, a filter was constructed according to Fig. 2 to provide a pass band of about 400 cycles with a center frequency of 105 kilocycles. Resonators 10, 11 and 12 were 0.240 inch in diameter by 0.537 inch in length; the coupling necks were 0.061 inch in diameter by 0.264 inch in length; and mounting extensions 15' and 16' were 0.061 inch in diameter by 0.792 inch in length. The material used was "Ni Span C."

When it is not practical to employ coated extensions of sufficient length to provide a desired termination loss, the filter may be constructed with removable terminal blocks, and with lossy terminating lines, as will be described in connection with Figs. 6 and 7.

Figures 3, 4:
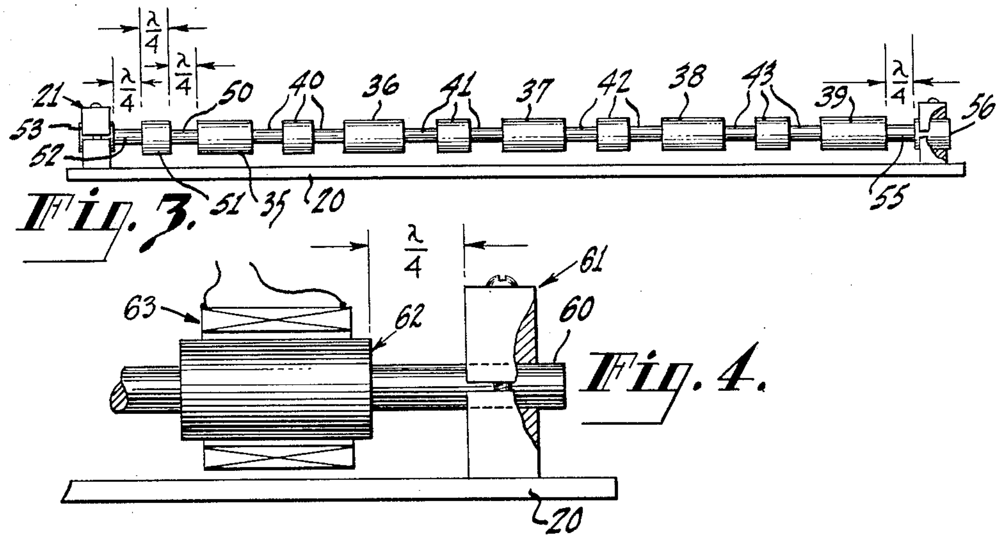
Fig. 3 is an elevation of a five-resonator magnetostrictive wave filter securely mounted at opposite ends by means of terminations having unlike characteristics.
Fig. 4 is a fragmentary elevation of a resonator having a mounting extension of reduced cross section which is securely clamped at a distance from the resonator element which corresponds with one quarter wavelength in the extension.

Fig. 3 shows a very narrow band filter made up of five resonator elements 35 through 39, the elements being coupled by multiple coupling systems 40, 41, 42, and 43. The coupling systems comprise a central mass of enlarged cross section connected by means of necks coupled to adjacent resonator elements. By this construction a given degree of coupling can be obtained with connecting necks of greater cross sectional area so that the entire assembly is characterized by a higher degree of mechanical ruggedness than could be obtained by the use of simple necks not having a central mass of enlarged cross section. In the example illustrated in Fig. 3, the multiple coupling systems comprise central masses and connecting necks, each of which is a quarter of a wave in length. The filter is mounted on one end by means of a complex mounting extension consisting of, in the order named, a mounting neck 50, an enlarged mass 51, a second neck 52 and a terminal block 53, terminal block 53 being securely clamped to base 20 by means of clamping blocks 21. Necks 50 and 52 and central mass 51 are each of length equal to an odd multiple of a quarter wave. This mounting means provides very loose coupling between end resonator element 35 and terminal block 53.

A tighter form of mounting is shown at the opposite end of the filter where resonator 39 is provided with a quarter wave mounting extension 55 having a terminal block 56 clamped to base 20. It will be understood that a filter may be constructed to be unsymmetrical as shown in Figure 3, when this is desired, or both mounting extensions may be like that shown on the left side of the filter of Figure 3, or both may be like that shown on the right side. A filter like that shown in Figure 3, preferably having both ends mounted in the manner shown on the left-hand side, can be provided to have a frequency response characteristic suitable for carrier frequency selection in a single-sideband receiver. A filter for such a purpose must be very accurately tuned and must be mounted in such a manner that the active portions of the filter can vibrate with complete freedom.

Fig. 4 illustrates a resonator element provided with a mounting extension 60 having an arbitrary length greater than an odd multiple of a quarter wave. Mounting extension 60 is clamped by clamping blocks 61 positioned to engage the extension 60 at a distance from the end of the resonator element which is a quarter wavelength or odd multiples thereof. According to this construction, terminal blocks are not employed and the effectiveness of the mounting depends upon the accuracy with which the extension 60 is clamped at the proper distance from the resonator element. The construction shown in Figs. 1, 2 and 3 is superior in that the terminal mounting block is constructed to accurately determine the distance to the resonator element and considerable leeway is permitted in the position at which the terminal mounting block may be clamped by the clamping blocks. For example, referring to Fig. 8, the terminal block 87 advantageously may be clamped by clamp 88 in the manner shown to insure that the clamp is effective at the end of the quarter wave extension.

It will be understood that the advantages of using mounting extensions which are an odd multiple of a quarter wave in length can be had in filters employing any useful mode of mechanical vibration, and any system of mechanical coupling between the resonator elements. The mechanical filters shown and described herein by way of example comprise a plurality of mechanically resonant cylindrical elements, each a half wave or multiples thereof in length, which operate in torsion, that is, one end of the resonator rotates about its longitudinal axis and the other end rotates similarly, in a 180-degree out-of-phase relationship, if the resonator is an odd multiple of a half wave in length. The dimensions of the coupling necks between the resonator elements have dimensions chosen to give the desired amount of coupling. A biasing flux may be provided by permanently magnetizing the resonator element in a circular manner. This may be done by choosing an appropriate magnetostrictive material having a thermo-elastic coefficient of substantially zero, such as "Ni Span C" made by H. A. Wilson Co., and by passing direct current through the filter assembly from end to end. There then is residual magnetism in all resonator elements, and each can be individually driven and tuned to the exact desired frequency.

In the use of the resonator assembly, a driver coil is placed around resonator 10 of Figs. 1 and 2, and resonator 35 of Fig. 3; and an output coil is placed around resonator 12 of Figs. 1 and 2, and resonator 39 of Fig. 3. The input and output coils may be arranged around an end resonator 62, as shown in Fig. 4, the numeral 63 designating a coil.

Figures 6, 7:
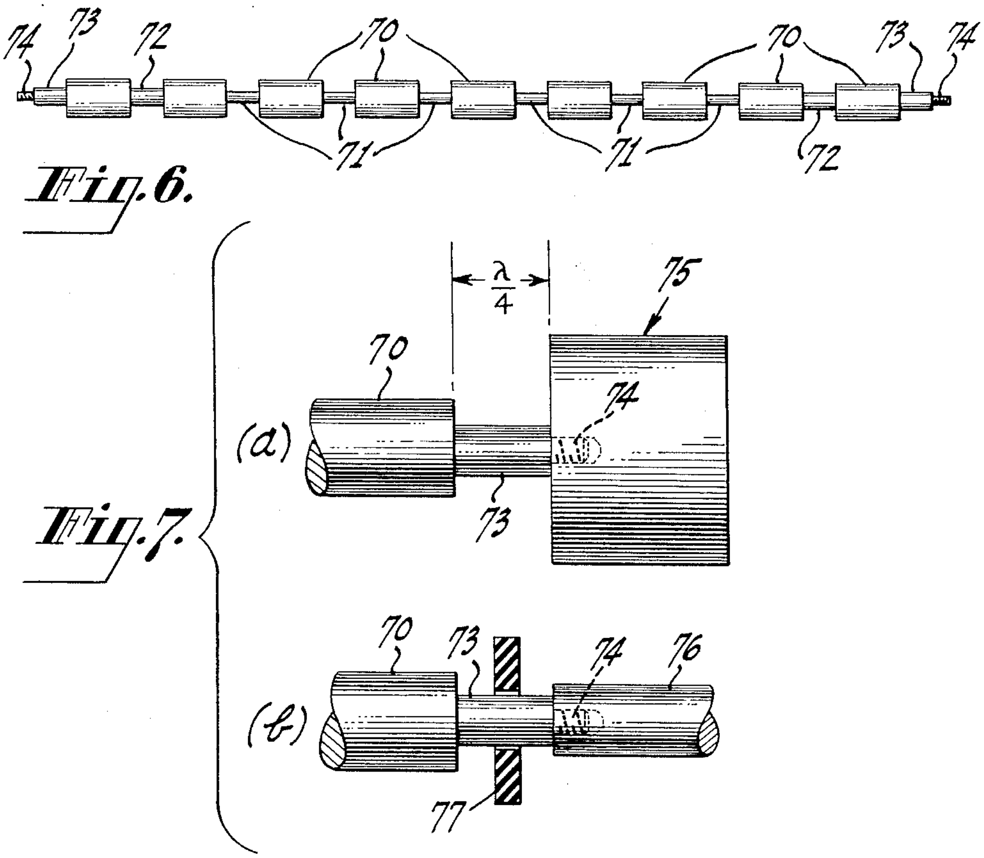
Fig. 6 is an elevation of a nine resonator mechanical filter having provisions for tuning and for the attachment of mechanically lossy termination lines.
Fig. 7 shows greatly enlarged fragmentary views of an end of the filter of Fig. 6 which will be used in explaining the tuning and terminating procedure.

Reference now will be made to Figs. 6 and 7 for a description of a construction which provides a better termination over the pass band than can be had with the relatively short terminating extension used in the construction shown in Fig. 2. There are nine half wave resonator elements 70 coupled by quarter wave necks 71 and 72. The end resonator elements 70 are provided with quarter wave extensions 73 having threaded ends 74 of reduced diameter beyond the quarter wave portions. Each resonator 70, except the end resonators, are individually tuned in succession to the desired frequency by clamping the two adjacent resonators and driving the resonator with a frequency measuring circuit. The tuning may be done with a signal generator and a bridge as described on page 361 of an article entitled "Mechanical filters for radio frequencies" by Walter van B. Roberts and Leslie L. Burns, Jr., in the September 1949 issue of the "RCA Review."

In tuning an end resonator element, a terminal mass 75, as shown in Fig. 7*a*, is screwed on the threads 74 of an extension 73. The adjacent resonator element is clamped and the end resonator is tuned to the desired frequency as described above. It is not necessary to clamp the terminal mass 75 if it is as large, relative to the resonator elements, as is shown in Fig. 7*a*. The terminal mass 75 is then removed and a mechanically lossy line 76 is threaded on threads 74 of the extension 73 and sweated or otherwise securely fixed on the end of extension 73. The lossy line 76 is of dimensions and material to provide the desired mechanical termination impedance. The material may be lead, or aluminum covered with an adhesive tape, and the line may be in the order of two feet in length. The line may be coiled to occupy less space. The assembly is mounted for use by means of a cradle 77, which may be in the form of a gum rubber washer, engaging extension 73. The foregoing tuning and mounting procedure is performed at both ends of the device shown in Fig. 6, and it permits the accurate tuning of the resonator elements in such a manner that the tuning is not disturbed by the subsequent addition of the mechanically lossy termination lines.

Solely by way of example, a filter as shown in Fig. 6 having a pass band of about 100.15 to 103.05 kilocycles was constructed from one piece of "Ni Span C" alloy stock 0.240 inch in diameter, necks 71 being 0.0945 inch in diameter, necks 72 and extensions 73 being 0.103 inch in diameter, resonator elements 70 being 0.558 inch long, and necks 71 and 72 and extensions 73 being 0.279 inch long. The lossy line terminations consisted of aluminum rods one-eighth of an inch in diameter by two feet long, the rods being covered with rayon pressure-sensitive tape.

Figure 8:
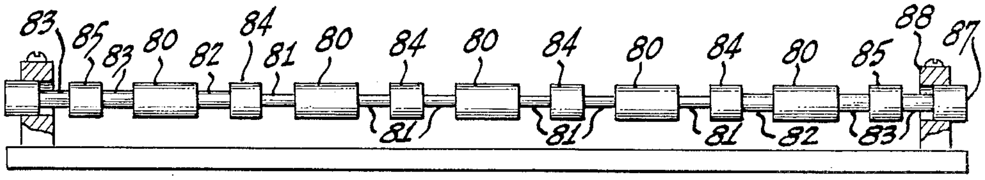
Fig. 8 is an elevation of a filter, like that shown in Fig. 3, which will be used in giving an example of an actual design.

As an example of a narrow band filter, one as represented in Fig. 8 (which is similar to the filter shown in Fig. 3) providing a pass band of about 22 cycles with a center frequency of 100 kilocycles was constructed from one piece of "Ni Span C" alloy stock 0.240 inch in diameter, resonator 80 being 0.568 inch long, coupling necks 81 and 82, mounting extension necks 83, coupling masses 84 and mounting extension masses 85 being 0.284 inch long, coupling necks 81 being 0.088 inch in diameter, and coupling necks 82 and mounting extension necks 83 being 0.096 inch in diameter.

What is claimed is:

1. A mechanical resonator unit comprising, a plurality of resonator elements dimensioned to be resonant at a given frequency and coupling means therebetween, two fixed terminal masses, and mounting extensions of length equal to substantially an odd multiple including one of a quarter wavelength therein at said given frequency connecting each terminal mass with an end resonator element, said extensions having a mechanically lossy characteristic.

2. A mechanical resonator unit as defined in claim 1 wherein said mounting extensions are integral with said resonator elements and said terminal masses, and are coated with a vibration absorbing material.

3. The method of tuning and terminating a mechanical filter having a plurality of coaxial coupled resonator elements dimensioned to be resonant at a given frequency, comprising the steps of connecting terminal masses to the end resonator elements by means of extensions having a length equal to substantially an odd multiple including one of a quarter wavelength therein at said given frequency, tuning each end resonator element with the adjacent resonator element clamped, removing the terminal masses, and attaching mechanically lossy termination lines to the end resonator elements.

4. The method of tuning and terminating a mechanical filter having a plurality of coupled resonator elements dimensioned to be resonant at a given frequency, comprising the steps of providing extensions from the end resonator elements which have a length substantially equal to an odd multiple including one of a quarter wavelength therein at said given frequency, connecting terminal masses to the ends of said extensions, tuning each end resonator element with the adjacent resonator element clamped, removing the terminal masses, and connecting mechanically lossy termination lines to said extensions.

5. The method defined in claim 4 and in addition the further step of mounting said filter on flexible cradles engaging said extensions.

6. A mechanical filter comprising a plurality of resonator elements dimensioned to be resonant at a given frequency and coupled to one another in an end-to-end relationship by means of coupling necks of reduced cross section, a rigid supporting base, a mounting link of reduced cross section extending from each of the end ones of said resonator elements, and means to clamp said links to said base at a distance from said end resonator elements equal to substantially an odd multiple including one of a quarter wavelength therein at said given frequency.

7. A mechanical resonator comprising a resonator element dimensioned to be resonant at a given frequency, a coaxial integral extension of reduced cross section extending from one end of said element, a base, and means to rigidly mount said extension on said base at a distance along said extension from said resonator element equal to an odd multiple including one of a quarter wavelength therein at said given frequency, the other end of said element being adapted for coupling to an additional resonator element.

8. A mechanical resonator comprising a resonator element dimensioned to be resonant at a given frequency, a terminal mass, a link of reduced cross section having a length equal to an odd multiple including one of a quarter wavelength therein at said given frequency connecting one end of the resonator element and the terminal mass, a base, and means to rigidly clamp the terminal mass to said base, the other end of said resonator element being adapted for coupling to an additional resonator element.

9. A mechanical resonator as defined in claim 8 wherein the resonator element, the terminal mass and the link are integral with each other.

10. A magnetostrictive resonator system comprising a plurality of coaxial resonator elements and mechanical coupling means therebetween, a coaxial mounting extension of reduced cross section connected to an end one of said elements, a base, and means to rigidly clamp said extension to said base at a distance from said end resonator element which corresponds to substantially an odd multiple including one of a quarter wavelength therein at the frequency of oscillation of said resonator.

11. In a magnetostrictive wave filter, a plurality of resonator elements dimensioned to be resonant at a given frequency and coupling means therebetween, quarter wave mounting extensions integral with the end ones of said resonator elements, said extensions having a length substantially equal to an odd multiple including one of a quarter wavelength therein at said given frequency, terminal mounting blocks integral with said extensions, a base, and means to rigidly clamp said blocks to said base.

12. In a mechanical filter, an integral unit comprising; in the order named, a terminal mass, a mounting extension, a plurality of resonators dimensioned to be resonant at a given frequency and coupling means therebetween, a second mounting extension and a second terminal mass, a base, and means to rigidly clamp said terminal masses to said base, said mounting extensions having a length substantially equal to an odd multiple including one of a quarter wavelength at said given frequency.

13. A magnetostrictive wave filter comprising a plurality of resonator elements dimensioned to be resonant at a given frequency coupled together by necks of reduced cross section, mounting extensions of reduced cross section extending coaxially from the end resonator elements a distance equal to substantially an odd multiple including one of a quarter wavelength therein at said given frequency, terminal masses at the ends of said extensions, a base, and means to rigidly clamp said terminal masses to said base.

14. A mechanical resonator unit as defined in claim 13 wherein said mounting extensions have a mechanically lossy characteristic.

15. A mechanical resonator unit comprising, a plurality of resonator elements dimensioned to be resonant at a given frequency and coupling means therebetween, two terminal masses, and quarter wave mounting extensions connecting each terminal mass with an end resonator element, said mounting extensions having a length substantially equal to an odd multiple including one of a quarter wavelength therein at said given frequency, a base, and means to rigidly clamp said terminal masses to said base.

16. In an electromechanical filter, a mechanical resonator dimensioned to be resonant at a given frequency, means for mounting said resonator comprising an integral mounting extension, a base, means to rigidly clamp said extension to said base at a distance from said resonator substantially equal to an odd multiple including one of a quarter wavelength therein at said given frequency, and a coating of damping material on said extension.

17. A mechanical filter comprising a plurality of resonator elements dimensioned to be resonant at a given frequency, mechanical coupling means between said resonators, extensions from the end resonator elements having a length equal to substantially an odd multiple including one of a quarter wavelength therein at said given frequency, terminal masses, means to removably secure said terminal masses to the ends of said extensions, whereby said end resonator elements may be accurately tuned, mechanically lossy termination lines, and means to secure said lines to the ends of said extensions in place of said terminal masses, whereby the filter may be properly terminated after the end resonators have been accurately tuned.

References Cited in the file of this patent

UNITED STATES PATENTS

| | | |
|---|---|---|
| 2,052,008 | Woodruff | Aug. 25, 1936 |
| 2,167,078 | Lakatos | July 25, 1939 |
| 2,401,094 | Nicholson | May 28, 1946 |
| 2,578,452 | Roberts | Dec. 11, 1951 |
| 2,619,604 | Burns | Nov. 25, 1952 |
| 2,647,948 | Roberts et al. | Aug. 4, 1953 |
| 2,693,579 | Doelz | Nov. 2, 1954 |

OTHER REFERENCES

Burns: RCA Review, March 1952, pp. 34–46. (Copy in 333—71.)